(12) United States Patent
Staszewski et al.

(10) Patent No.: US 8,284,886 B2
(45) Date of Patent: Oct. 9, 2012

(54) RADIO FREQUENCY BUILT-IN SELF TEST FOR QUALITY MONITORING OF LOCAL OSCILLATOR AND TRANSMITTER

(75) Inventors: Robert B. Staszewski, Garland, TX (US); Dirk Leipold, Plano, TX (US); Elida de-Obaldia, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1304 days.

(21) Appl. No.: 10/758,863

(22) Filed: Jan. 16, 2004

(65) Prior Publication Data

US 2004/0146132 A1 Jul. 29, 2004

Related U.S. Application Data

(60) Provisional application No. 60/441,080, filed on Jan. 17, 2003.

(51) Int. Cl.
*H03D 3/24* (2006.01)
(52) U.S. Cl. ........ 375/376; 375/224; 375/226; 375/227; 375/371; 375/373; 375/375; 455/260; 455/516; 327/147; 327/156; 370/516
(58) Field of Classification Search ................ 375/224, 375/226, 375, 376, 227, 371, 373; 327/141, 327/147, 156; 455/423, 425, 260, 516
See application file for complete search history.

(56) References Cited

U.S. PATENT DOCUMENTS

| | | | | |
|---|---|---|---|---|
| 4,086,539 A | * | 4/1978 | Gustafson et al. | 327/156 |
| 4,819,080 A | * | 4/1989 | Cucchietti et al. | 324/76.77 |
| 5,126,690 A | * | 6/1992 | Bui et al. | 331/1 A |
| 5,295,079 A | * | 3/1994 | Wong et al. | 714/715 |
| 5,486,792 A | * | 1/1996 | Girardeau, Jr. | 331/10 |
| 5,598,448 A | * | 1/1997 | Girardeau, Jr. | 375/376 |
| 5,768,326 A | * | 6/1998 | Koshiro et al. | 375/376 |
| 5,825,253 A | * | 10/1998 | Mathe et al. | 331/18 |
| 5,870,002 A | * | 2/1999 | Ghaderi et al. | 331/17 |
| 5,966,428 A | * | 10/1999 | Ortiz Perez et al. | 379/27.02 |
| 5,982,832 A | * | 11/1999 | Ko | 375/371 |
| 6,687,629 B1 | * | 2/2004 | Yamaguchi et al. | 702/69 |
| 6,885,700 B1 | * | 4/2005 | Kim et al. | 375/224 |
| 7,079,611 B2 | * | 7/2006 | Knudsen | 375/354 |
| 2002/0001359 A1 | * | 1/2002 | Skierszkan et al. | 375/355 |
| 2002/0094052 A1 | * | 7/2002 | Staszewski et al. | 375/376 |

(Continued)

OTHER PUBLICATIONS

Bernad Sklar "Digital Communications" $2^{nd}$ edition pp. 604-605.*

(Continued)

*Primary Examiner* — Leon Flores
(74) *Attorney, Agent, or Firm* — Ronald O. Neerings; Wade James Brady, III; Frederick J. Telecky, Jr.

(57) ABSTRACT

A system and method for low-cost performance and compliance testing of local oscillators and transmitters for wireless RF applications. A preferred embodiment comprises observing a digital signal from within an RF circuit, manipulating the signal with digital signal processing techniques, and determining if the RF circuit passes a test based upon results from the manipulating. Since the signal is clocked at a much lower frequency than an RF output of the RF circuit and the manipulation is performed digitally, testing can be performed at different stages of the production cycle and expensive test equipment can be eliminated.

51 Claims, 7 Drawing Sheets

U.S. PATENT DOCUMENTS

2002/0191727 A1* 12/2002 Staszewski et al. ........... 375/376

OTHER PUBLICATIONS

"Digital Cellular Telecommunications Systems (Phase 2+); Radio Transmission and Reception", (GSM 05.05 version 8.5.1 Release 1999), GSM Global System for Mobile Communications, ETSI EN 300 910 V8.5.1 (Nov. 2000), European Standard (Telecommunications series), pp. 2-95.

"Core", Specification of the Bluetooth System, Specification vol. 1, Wireless Connections Made Easy, Version 1.1, Feb. 22, 2001, pp. 2-181.

* cited by examiner

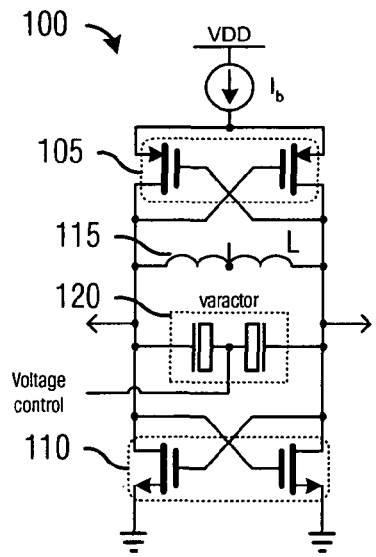
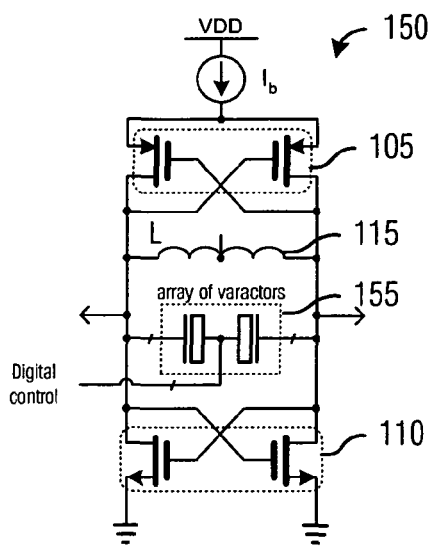
*Fig. 1a*  *Fig. 1b*
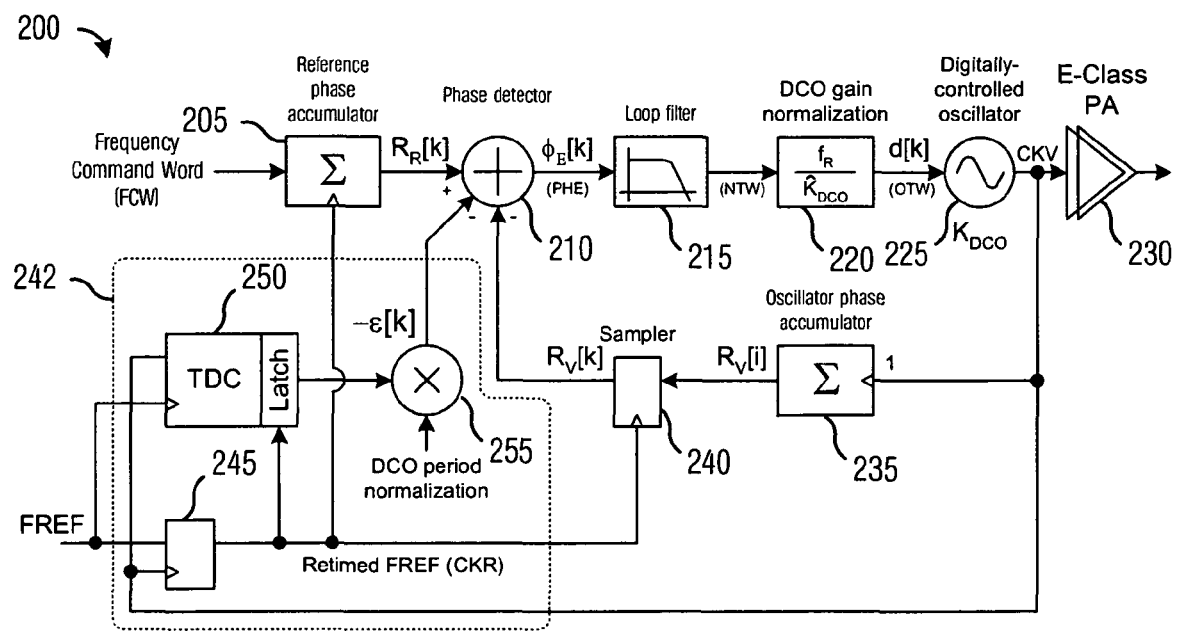
*Fig. 2*

RADIO FREQUENCY BUILT-IN SELF TEST FOR QUALITY MONITORING OF LOCAL OSCILLATOR AND TRANSMITTER

This application claims the benefit of U.S. Provisional Application No. 60/441,080, filed on Jan. 17, 2003, entitled "Type-II All-Digital PLL in Deep-Submicron CMOS", which application is hereby incorporated herein by reference.

CROSS-REFERENCE TO RELATED APPLICATIONS

This application is related to the following co-pending and commonly assigned patent applications: Ser. No. 09/728,180, filed Dec. 1, 2000, entitled "Digital PLL with Gear Shift," Ser. No. 10/464,957, filed Jun. 19, 2003, entitled "Type-II All-Digital Phase-Locked Loop (PLL)," and Ser. No. 10/464,982, filed Jun. 19, 2003, entitled "Fine-Grained Gear-Shifting of a Digital Phase-Locked Loop (PLL)" which applications are hereby incorporated herein by reference.

TECHNICAL FIELD

The present invention relates generally to a system and method for digital wireless radio frequency (RF) applications, and more particularly to a system and method for low-cost performance and compliance testing of local oscillators and transmitters for wireless RF applications.

BACKGROUND

The continued development of circuit integration technology has allowed for an unprecedented degree of scaling and integration of digital circuitry. Large scale integrated circuits (IC) can allow for an overall reduction in the cost of the applications that make use of the integrated circuits.

However, a significant portion of an IC's overall cost can be due to production testing. This can be especially true when the IC is a complex mixed-signal IC used in RF wireless applications. The testing of these ICs may include standards compliance testing in addition to full functional (both digital and analog) testing. The standard testing procedure involves the functional and compliance testing of the IC after they have been packaged.

One disadvantage of the prior art is that the testing can require expensive and sophisticated test equipment. The potentially large expense can reduce the total number of test equipment available, therefore the testing can be a bottleneck in the production of the ICs.

A second disadvantage of the prior art is that the testing cannot be performed until after the ICs have been packaged. Then, if an IC is found to be defective, the IC (along with the package) may need to be discarded. This can be expensive, since the packaging can represent a large percentage of the cost of the IC. Alternatively, the IC may need to be removed from its package, but this can be difficult and time intensive.

A third disadvantage of the prior art is that the testing cannot usually be performed once the packaged IC leaves the factory. Therefore, testing in the field cannot be done to help diagnose performance issues that may arise during actual use, which may not be reproducible in the factory.

SUMMARY OF THE INVENTION

These and other problems are generally solved or circumvented, and technical advantages are generally achieved, by preferred embodiments of the present invention which provides a system and method for low-cost performance and compliance testing of local oscillators and transmitters for wireless RF applications.

In accordance with a preferred embodiment of the present invention, a method for testing a radio frequency (RF) circuit comprising observing a signal from the RF circuit, wherein the signal is a digital signal from within the RF circuit, manipulating the signal, and producing a metric for the test based on results from the manipulating is provided.

In accordance with another preferred embodiment of the present invention, a circuit comprising a processor coupled to a radio frequency (RF) circuit, the processor containing circuitry to manipulate digital signals from the RF circuit to provide a performance metric for the RF circuit, and a control signal input coupled to the processor, wherein the control signal input can enable an observation and manipulation of the digital signals is provided.

In accordance with another preferred embodiment of the present invention, a circuit comprising a reference phase accumulator coupled to a signal input, the reference phase accumulator containing circuitry to compute a reference phase, a phase detector coupled to the reference phase accumulator, the phase detector containing circuitry to compute a difference between the reference phase and a variable phase, a digitally-controlled oscillator (DCO) coupled to the phase detector, wherein the performance of the DCO can be ascertained by observing an output of the phase detector, and a variable phase accumulator coupled to the DCO and the phase detector, the variable phase accumulator containing circuitry to compute the variable phase is provided.

An advantage of a preferred embodiment of the present invention is that the testing of the local oscillator and transmitter can be performed in a built-in self-test manner by observing and manipulating relatively low frequency digital signals. This can be performed without the need for expensive laboratory test equipment.

A further advantage of a preferred embodiment of the present invention is that the testing can be performed at multiple stages of an IC's life cycle. The testing can be performed on the die using test probes, after packaging, on a circuit board during product manufacturing, and in a self-contained device in the field. This is a heretofore unavailable degree of flexibility in testing.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b are diagrams of a voltage-controlled oscillator and a digitally-controlled oscillator;

FIG. 2 is a diagram of a phase-domain all-digital phase-locked loop;

DETAILED DESCRIPTION OF ILLUSTRATIVE EMBODIMENTS

Figure 3:
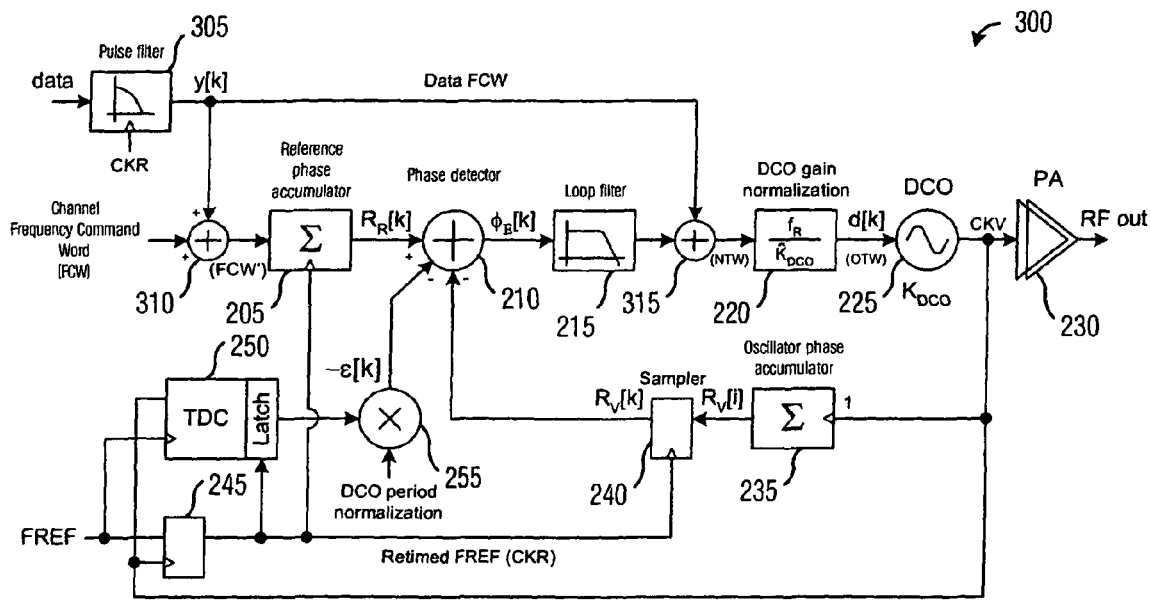
FIG. 3 is a diagram of a phase-domain all-digital transmitter.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an all-digital PLL (ADPLL)-based integrated radio that is adherent to the Bluetooth technical standard. The Bluetooth technical standard is specified in a document entitled "Specification Volume 1: Specification of the Bluetooth System, Core," version 1.1, published Feb. 22, 2001, which document is herein incorporated by reference. The invention may also be applied, however, to other ADPLL-based or digitally-intensive integrated radios that make use of a local oscillator and/or a transmitter. These all-digital integrated rations may be compliant to other technical standards, such as, GSM, IEEE 802.11, Hyperlan, Ultra-Wideband, and so forth or they may be a custom implementation of a proprietary radio design.

With reference now to FIGS. 1a and 1b, there are shown diagrams illustrating (FIG. 1a) a voltage-controlled oscillator (VCO) 100 and (FIG. 1b) a digitally-controlled oscillator (DCO) 150. Both the VCO 100 and the DCO 150 have several components in common, including cross-coupled pairs of PMOS and NMOS transistors 105 and 110 and an inductor 115. The major difference between the two lies in the control method of the capacitive part of the LC tank, which can be used for frequency tuning. The VCO 100 may use a single varactor 120 while the DCO 150 may have an array of varactors 155. The VCO 100 relies upon a developed tuning control voltage to control its oscillating frequency with a transfer function gain on the order of hundreds of MHz/Volt. However, in the case of the DCO 150, if each of the varactors in the array of varactors 155 is biased at a special point, the transfer function gain has been measured to be as low as 600 kHz/Volt. This low gain provides the DCO 150 with a significantly lower sensitivity to supply line noise than the VCO 100. This results in a lower overall spurious tone and phase noise for the DCO 150.

With reference now to FIG. 2, there is shown a block diagram illustrating a phase-domain all-digital synchronous phase-locked loop (ADPLL) synthesizer 200. The ADPLL 200 can be used to measure a phase difference between a reference signal, FREF (such as from a reference clock) and a variable signal (such as an output from a digitally controlled oscillator (DCO)) and to use that difference to make a frequency adjustment to the variable signal. For example, in a wireless device operating in a Bluetooth communications network, the variable signal would be in the 2.4 GHz band and the reference signal is at 13 MHz.

The difference between the reference phase and the variable phase may be referred to as a phase error, $\theta_E[k]$, and can be computed in a phase detector 210 of the ADPLL 200. The phase detector 210 may have three inputs. A first input to the phase detector 210 may be provided by a reference phase accumulator 205, which can be used to compute an accumulation of a frequency command word (FCW), also referred to as frequency control word, for the reference signal. The accumulated FCW is RR[k]. The accumulation can be done on every rising edge of the retimed FREF clock. The FCW can be defined as a ratio of an expected variable frequency to the frequency of the reference signal.

A second input to the phase detector 210 can be an accumulation of edge clock transitions for the variable signal. The accumulation of the edge clock transitions for the variable signal, $R_V[k]$, may be computed in an incremeter 235 and subsequently sampled in a clocked latch 240. A third input to the phase detector 210 can be a fractional error correction value, $\epsilon[k]$, computed by a fractional error correction unit 242. The fractional error correction unit 242 may be used to compute a fractional error correction, which is a difference between the reference clock edge and the variable clock edge. The fractional error correction can be computed by converting the above difference (the difference between the reference clock edge and the variable clock edge) from a time domain into a digital domain (via a time-to-digital converter (TDC) 250) and then multiplying the digital value with an inverse period (via a multiplier 255) to produce the fractional error correction value, $\epsilon[k]$. A latch 245 can be used to retime (re-sample) the reference clock cycle by the RF oscillator clock (output of the DCO 225), which can be used to clock the TDC 250, reference phase accumulator 205, and the clocked latch 240.

A loop filter 215 can then be applied to the phase error, $\theta_E[k]$. The loop filter 215 can provide a desired amount of attenuation to the phase error prior to affecting the DCO frequency, and can be constructed as a combination of FIR, IIR and accumulators, which could be connected in parallel or cascaded. Finally, DCO tuning (the signal used to adjust the DCO frequency) is normalized with respect to the DCO gain (ratio of frequency deviation per one step (least significant bit) of DCO tuning word) via a DCO gain normalization block 220 prior to being applied to the DCO 225. Output of the DCO 225 may be a variable phase signal and may be buffered and amplified by a power amplifier 230. A more detailed description of the ADPLL 200 and its operation can be found in the co-assigned and co-pending patent application "Type-II All-Digital Phase-Locked Loop (PLL)."

With reference now to FIG. 3, there is shown a diagram illustrating an ADPLL-based transmitter 300, according to a preferred embodiment of the present invention. According to a preferred embodiment of the present invention, the transmitter 300 can be based upon an ADPLL frequency synthesizer, such as one shown in FIG. 2, and makes use of digital direct frequency modulation. A modulating data, y[k], produced by filtering a data stream with a pulse shaping filter 305, may directly affect the oscillating frequency. This can be accomplished by summing the modulating data with the frequency normalized tuning word via a summing point 315. The normalized tuning word (after being summed with the modulating data) can be provided to the DCO gain normalization block 220.

Since the input to the DCO can have a frequency perturbation (due to the modulating data), the PLL loop will try to correct this perturbation. This correction can be compensated for by adding the modulating data, y[k], back into the PLL loop via a second summing point 310. The PLL loop response to the modulating data can be wideband in nature and the modulating data can directly modulate the DCO frequency in a feed-forward manner so that it can effectively remove the loop dynamics from the modulating transmit path. However, the remainder of the PLL loop (including error sources) continues to operate in a normal closed-loop regime.

Figure 4A:
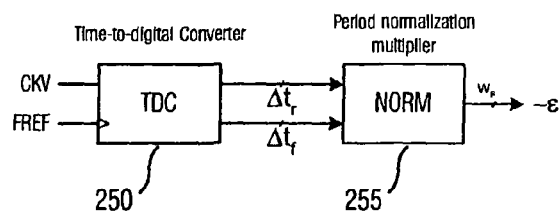
FIGS. 4a through 4c are diagrams of a detailed view of the operation of a time-to-digital converter (TDC), according to a preferred embodiment of the present invention.
Figure 4B:
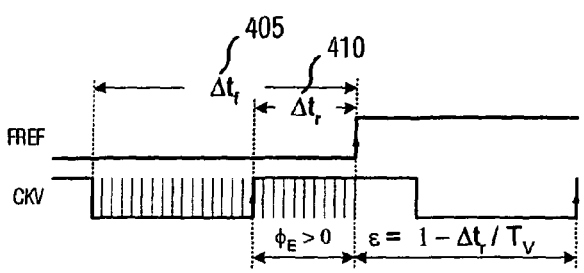
Figure 4C:
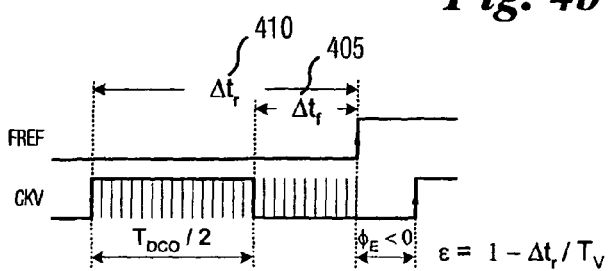

With reference now to FIGS. 4a through 4c, there are shown diagrams illustrating a detailed view of the operation of the TDC 250 (FIG. 2) and the estimation of fractional error correction using the TDC 250, according to a preferred embodiment of the present invention. As shown earlier and repeated in FIG. 4a, the TDC 250 may have a pair of inputs, the frequency reference, FREF, and the RF oscillator clock, CKV. Using these two inputs, the TDC 250 can measure the fractional delay difference between the frequency reference and the next rising edge of the RF oscillator clock. According to a preferred embodiment of the present invention, the resolution of the TDC 250 can be that of a single inverter delay, which for a deep-submicron CMOS process can be better than 40 pico-seconds.

The TDC 250 can produce as output two values, a time rising difference, $\Delta t_r$ (shown as interval 410), and a time falling difference, $\Delta t_f$ (shown as interval 405). The time rising difference, $\Delta t_r$, can be defined as the time difference between a rising edge of the RF oscillator clock and a rising edge of the frequency reference, while the time falling difference, $\Delta t_f$, can be defined as the time difference between a falling edge of the RF oscillator clock and a rising edge of the frequency reference (refer to FIGS. 4b and 4c for illustrations of the time rising and falling differences). The time rising and falling differences can then be normalized by the period normalization multiplier 255 which multiplies the differences with an inverse period to produce the fractional error correction value, $\epsilon$. The fractional error correction value may be expressed mathematically as: $\epsilon=1-\Delta t_r/T_V$, wherein $T_V$ is a duration of a period of the RF oscillator clock.

Figure 5:
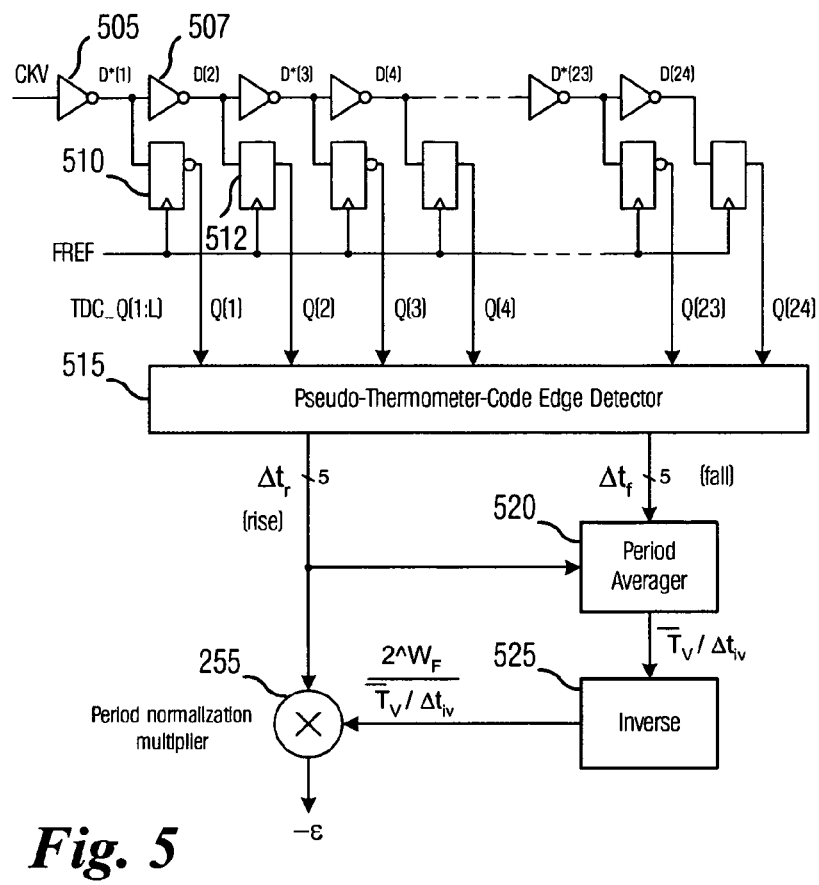
FIG. 5 is a diagram of a detailed view of the TDC and a period normalization multiplier, according to a preferred embodiment of the present invention.

With reference now to FIG. 5, there is shown a diagram illustrating a detailed view of the TDC 250 and period normalization multiplier 255, according to a preferred embodiment of the present invention. The TDC 250 can be created from a serially connected chain of inverters (such as inverters 505 and 507) and a plurality of latches (such as latches 510 and 512). In addition to being connected to the next inverter in the serial chain, each inverter's output is coupled to a latch. Note that due to signal inversion from the inverters, alternating latches may have an inverting output. For example, latch 510 may have an inverting output while latch 512 does not. The latches can be clocked by the frequency reference, FREF.

The outputs of the latches form a pseudo-thermometer code. Thermometer codes are considered to be well understood by those of ordinary skill in the art of the analog-to-digital conversion and will not be discussed herein. A pseudo-thermometer edge detector 515 can be used to detect the edges of the RF oscillator clock. The pseudo-thermometer edge detector 515 can also be used to determine the time rising and falling differences (as shown in FIGS. 4b and 4c). The time rising and falling differences can then be provided to a period averager 520 which averages the differences over a number of clock cycles. It has been found that averaging over 128 clock cycles can produce an accuracy level of within one (1) pico-second of an inverter delay. An output of the period averager 520 can then be inverted by an inverse unit 525 prior to being provided to the period normalization multiplier 255 to be used in the production of the fractional error correction value, $\epsilon(k)$.

Figure 6:
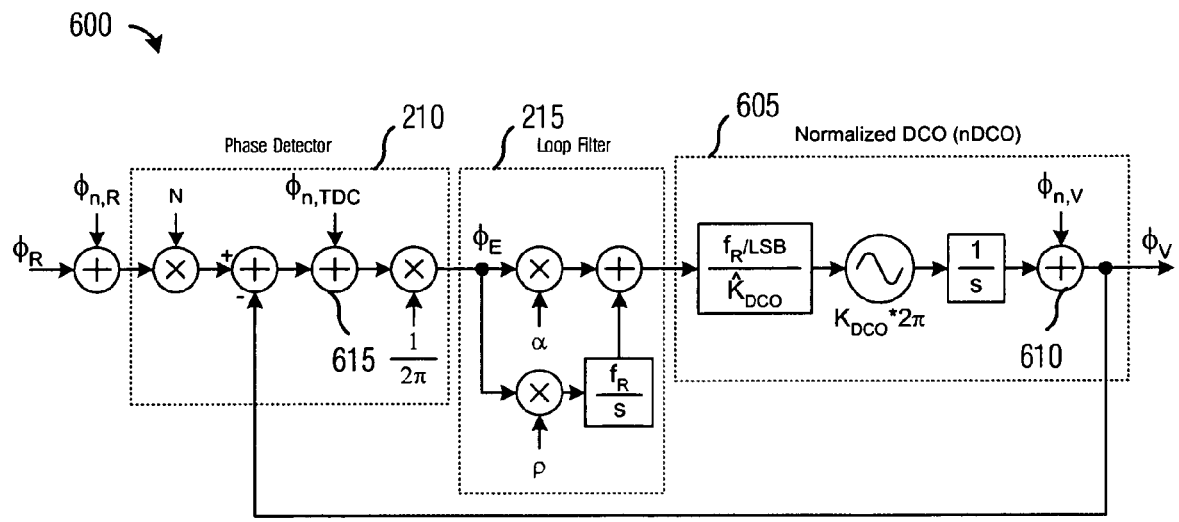
FIG. 6 is a diagram of a linear s-domain model of the all-digital phase-locked loop, according to a preferred embodiment of the present invention.

With reference now to FIG. 6, there is shown a diagram illustrating a linear s-domain model 600 of the ADPLL 200 (FIG. 2) when set in a type-II second order configuration, according to a preferred embodiment of the present invention. FIG. 6 illustrates a linear s-domain model for the phase detector 210, the loop filter 215, and a combination block 605, which includes the DCO gain normalization block 220 and the DCO 225 of the ADPLL 200 (FIG. 2). When operating in a type-II mode, the PLL loop has a closed-loop transfer function that can be expressed as:

$$H_{cl}(s) = N\frac{\alpha f_R s + \rho f_R^2}{s^2 + \alpha f_R s + \rho f_R^2}.$$

Figure 7A:
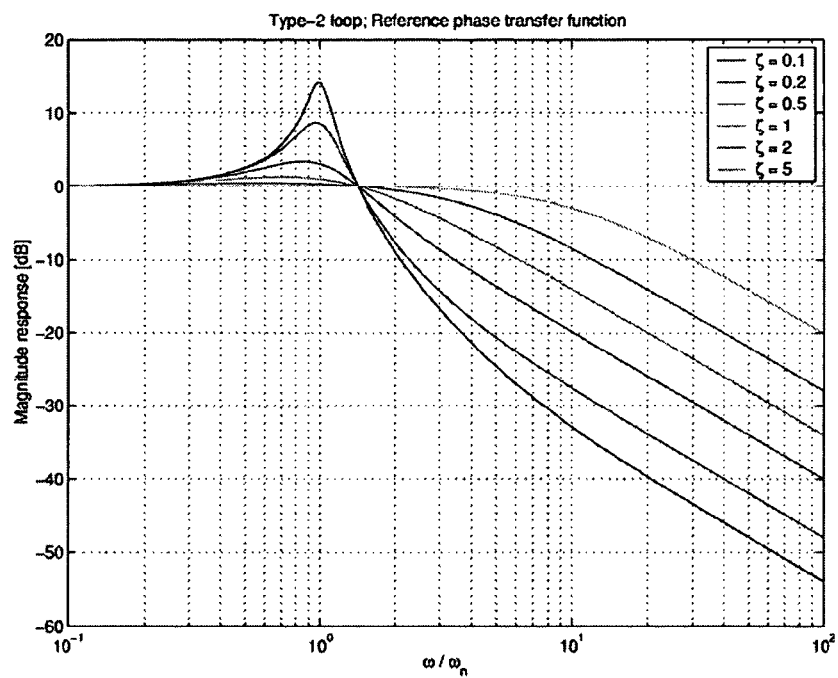
FIGS. 7a through 7c are plots of closed-loop transfer functions for different all-digital phase-locked loops, according to a preferred embodiment of the present invention.

A plot of the closed-loop transfer function for different values of $\zeta$ (wherein $$\zeta = \frac{\alpha f_R}{2\bar{\omega}_n} = \frac{1}{2}\frac{\alpha}{\sqrt{\rho}}$$

and $\bar{\omega}_n=\sqrt{\rho f_R}$) with normalized frequency is displayed in FIG. 7a. When operating in a type-I mode, the integral term, p, is turned off. The behavior of the closed-loop transfer function when the PLL loop is operating in a type-I mode with normalized frequency is displayed in FIG. 7b.

Taking a closer examination of the model 600, there may be two places internal to the PLL loop where noise can be injected. Due to its digital nature, the remainder of the PLL loop may be completely immune from any time-domain or amplitude-domain perturbations and therefore does not contribute to the phase noise of the PLL loop. A first internal noise source can be due to the oscillator (DCO 225) itself (modeled as summing point 610 with the noise being represented as $\theta_{n,V}$). The noise from the DCO 225 has a closed-loop transfer function that can be expressed as:

$$H_{cl,V}(s) = \frac{s^2}{s^2 + \alpha f_R s + \rho f_R^2}.$$

Figure 7B:
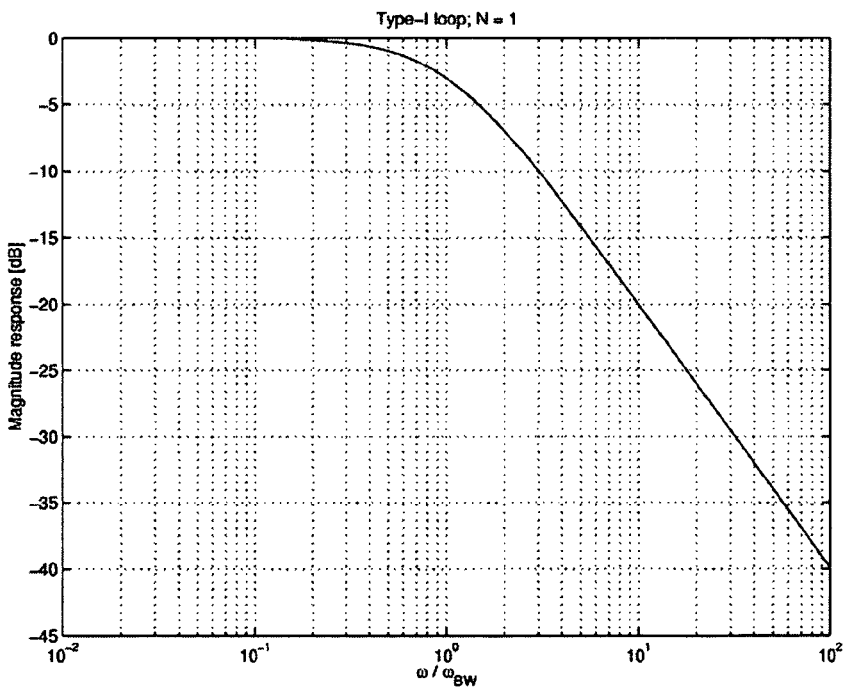
Figure 7C:
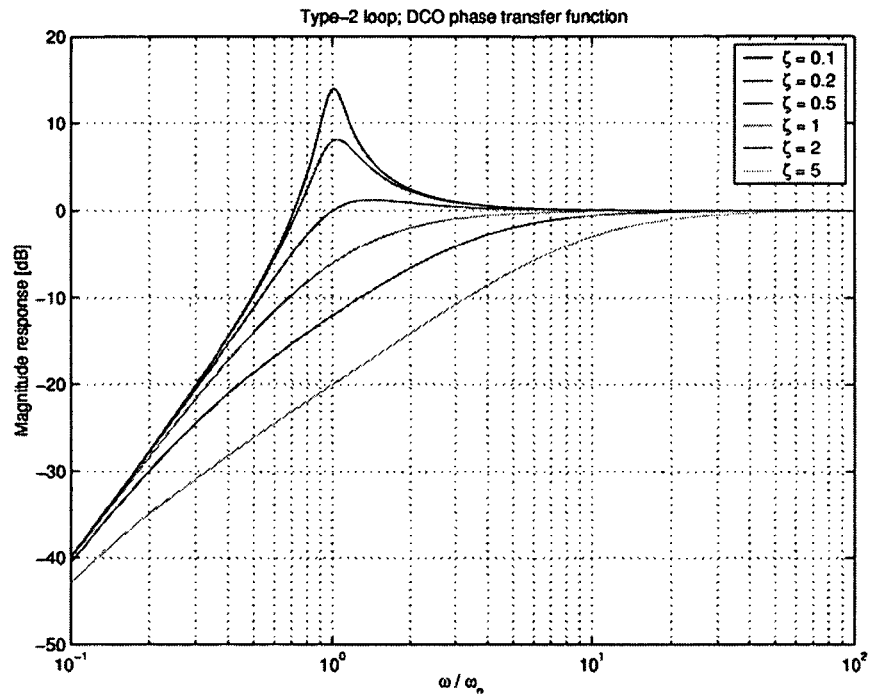

A plot of the closed-loop transfer function for different values of $\zeta$ with normalized frequency is displayed in FIG. 7c.

A second internal noise source can be due to TDC 250 calculating the fractional error correction value, $\epsilon[k]$, and can be modeled as a second summing point 615 with the noise being represented as $\theta_{n,TDC}$. Although the TDC 250 is a digital circuit, its frequency reference and the RF oscillator clock inputs are continuous in the time domain. The TDC noise can have several components: quantization, linearity, and random (due to thermal effects), with perhaps the quantization noise being the most predominant. The noise from the TDC 250 has a closed-loop transfer function that can be expressed as:

$$H_{cl,TDC}(s) = \frac{\alpha f_R s + \rho f_R^2}{s^2 + \alpha f_R s + \rho f_R^2}.$$

Note that the TDC noise can have the same transfer function as the PLL loop noise but without the gain of N. This may be due to the fact that the TDC phase signal can be normalized to the DCO clock cycle.

As discussed previously, the testing of integrated circuits, especially mixed-signal ICs that include RF circuitry, can be expensive and require a lot of laboratory equipment. Furthermore, the testing can often only be performed in the factory after the ICs have been packaged. This can lead to high testing costs and the waste of expensive packaging when the ICs in them are found to be faulty. It is therefore desired that testing can take place at other times within the fabrication life cycle of the IC, such as after fabrication (prior to packaging), on wafer, after packaging, after placement on a circuit board, and out in the field.

Testing that can be performed outside of a factory (i.e., in the field) can have several advantages. First, the testing can usually be done without the use of expensive laboratory equipment, therefore, testing can be less expensive. Since expensive equipment is not needed, the testing of a larger number of devices can be done at one time (since the constraint of expensive equipment has been removed). Second, the testing can be performed while the electronic device is in the end-user's hands. This can lead to some novel test scenarios. For example, if the device under test is a cellular telephone, the carrier can run tests on the device each time that the telephone is powered-up or dialed by the end-user and then the device can provide the results to the carrier. The carrier can then detect if the device is beginning to fail and provide a warning to the end-user of impending failure via an instant message or in the next bill. Alternatively, the carrier can run diagnostics in response to performance complaints from the user.

With the ADPLL 200 (FIG. 2) and the transmitter 300 (FIG. 3), it is possible to ascertain, with adequate accuracy, the performance at the RF output by observing an internal digital signal, such as the PHE ($\theta_E$) output of the phase detector 210 (FIGS. 2, 3 and 6). Since the PHE output of the phase detector 210 may be clocked at the frequency reference rate (FREF), it is at a much lower frequency than the multi-GHz RF output. In addition to observing the PHE signal, other signals can also be used, such as the output of the loop filter 215 (referred to as NTW) and the output of the DCO gain normalization block 220 (referred to as OTW (d[k]), which can be binary or encoded. The NTW signal and the OTW signal can be observed in place of the PHE signal as long as the frequency components of interest of the PHE signal is lower than the cutoff frequency of the loop filter 215. As long as the frequency components of interest are below the loop filter's cutoff frequency, the attenuation of frequency components above the cutoff frequency can actually improve the correlation between the observed signal and the RF output. Furthermore, if the loop filter 215 has been implemented as a cascade of filters (a multi-stage filter), outputs from intermediate filters from within the cascade of filters can be used for observation purposes even if the output from the end of the cascade of filters is attenuated at the frequency components of interest.

The PHE signal has a low-pass transfer characteristic to/from the phase at the RF output of the ADPLL (or transmitter), which for large values of $\zeta$, or in type-I operation, may have unity value and be relatively flat until the PLL loop bandwidth cutoff (reference FIGS. 7a and 7b). Consequently, the close-in phase noise and phase error statistics performed on the PHE signal can closely correlate with the tests results that are performed directly at the RF output. It should be noted that it is possible to include the frequency components beyond the bandwidth cutoff as long at the PLL loop droop can be compensated.

Figure 8:
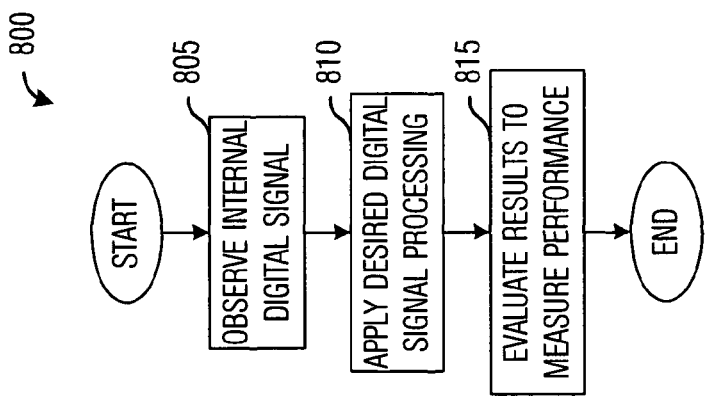
FIG. 8 is a diagram of a sequence of events in the testing of an all-digital frequency synthesizer or transmitter, according to a preferred embodiment of the present invention.

With reference now to FIG. 8, there is shown a diagram illustrating a sequence of operations 800 that can be used to test the performance and compliance of an all-digital frequency synthesizer and/or transmitter, according to a preferred embodiment of the present invention. According to a preferred embodiment of the present invention, the sequence of operations 800 can be used to test either the function, performance and/or the compliance of a mixed-signal integrated circuit that contains an ADPLL or transmitter similar to those displayed in FIGS. 2 and 3. The testing can be initiated manually by the manufacturer or the end-user of the integrated circuit (or an electronic device containing the integrated circuit) by entering an appropriate command(s) or automatically upon power-up, after reset, when a call is being made, and so forth.

A first operation of the testing involves the observation of an internal digital signal (block 805). According to a preferred embodiment of the present invention, the internal digital signal should be a signal that is a part of the PLL loop in the ADPLL or transmitter, such as the PHE signal at the output of phase detector 210 (FIGS. 2 and 3). Alternatively, if the digital signal being observed has a frequency range of interest that is below the cutoff frequency of the loop filter 215 (FIGS. 2 and 3), then the output of the loop filter 215 can be observed, as well as the output of the DCO gain normalization block 220. An advantage in the use of the digital signal is that it is clocked at the frequency reference which is clocked at a rate that is significantly lower than the RF output signal, which is clocked at a rate that is on the order of several GHz. It should be noted that the observation of the internal digital signal can also include adjusting the operation of a part (or parts) of the PLL loop, such as changing a coefficient in the loop filter 215 to set the bandwidth of the PLL loop, for example, and observing the digital signal after each adjustment. From these observations, it can be possible to ascertain more detailed information about the performance and/or compliance of the PLL loop.

Once the digital signal is under observation, the digital signal can be manipulated digitally (block 810). The digital signal can be manipulated by a digital signal processor (DSP) that may be integrated into the integrated circuit. Alternatively, the manipulation can be performed by custom designed signal processors integrated expressly for test purposes. Due to the scale of the integration in modern integrated circuits, the inclusion of tens or hundreds of thousands of logic gates needed to perform the manipulation would incur a small additional expense, especially when compared to the cost of the dedicated test equipment that would otherwise be needed to test the integrated circuits. A detailed discussion of the manipulation of the observed digital signal is presented below.

The results of the manipulations of the digital signal can then be evaluated to measure the performance of the frequency synthesizer or the transmitter (block 815). The evaluation may be as simple as comparing the results with a threshold. If the results fall within a specified threshold, then the integrated circuit can be said to have passed that one particular test, for example. The sequence of operations 800 may be repeated as many times as needed to complete the desired tests.

Figure 9B:
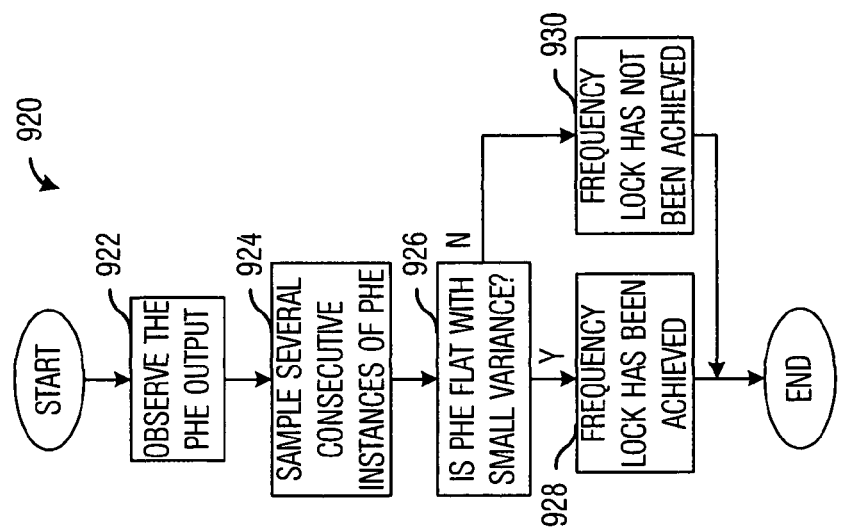
FIGS. 9a through 9d are diagrams of sequences of events in the testing of an all-digital frequency synthesizer or transmitter, according to a preferred embodiment of the present invention.
Figure 9A:
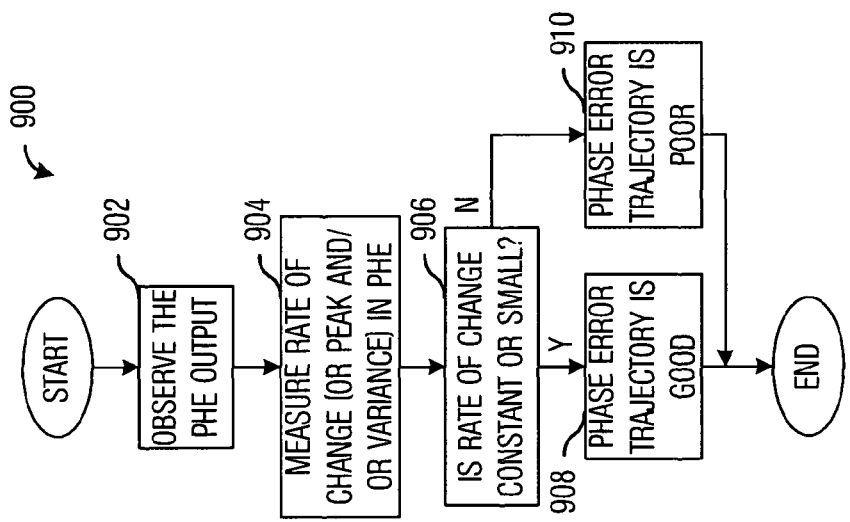

With reference now to FIG. 9*a*, there is shown a diagram illustrating a sequence of operations 900 that can be used to test the compliance of a transmitter by testing the phase error trajectory, according to a preferred embodiment of the present invention. The PHE signal may be thought off as a difference between the actual phase (at the RF output) and the desired phase. If the actual phase matches closely to the desired phase, then the low frequency components of the PHE signal may remain relatively constant (a small value of change or zero change). Of particular interest are the peak and rms values of the change. Referencing FIG. 3, the output of the phase detector 210 can be shown to be a difference between the actual phase and the desired phase. Therefore, after observing the PHE signal (block 902), the manipulation of the PHE signal may entail measuring the peak and/or variance, or the rate of change in the PHE signal (block 904). If the peak and/or variance of the change, or the rate of change, in the PHE signal is very small or if there is no change in the PHE signal (block 906) then the phase error trajectory can be deemed to be good (block 908), else the phase error trajectory can be bad (block 910). According to the GSM technical specifications, there is a limit placed upon a transmitter's phase error trajectory. Therefore, this test can determine if the transmitter is compliant to the GSM technical specifications.

With reference now to FIG. 9*b*, there is shown a diagram illustrating a sequence of operations 920 that can be used to detect frequency lock of an all-digital frequency synthesizer and/or transmitter, according to a preferred embodiment of the present invention. In an ADPLL, when the PLL loop has locked onto a desired frequency, the signal values through the loop do not change (or change very little). This can then be exploited to create a lock indicator. After observing the PHE signal (block 922), several consecutive values of the PHE signal can be examined to determine the rate of change in the PHE signal (block 924). If the rate of change in the PHE signal is flat or has a very small variance (block 926), then frequency lock has been achieved (block 928). If the rate of change in the PHE signal is not flat or there is a significant variance, then the PLL loop has not locked onto the desired frequency (block 930). This operation can be repeated several times during critical times in the PLL operation, or it can be repeated continuously to monitor for a continuing lock.

Figure 9D:
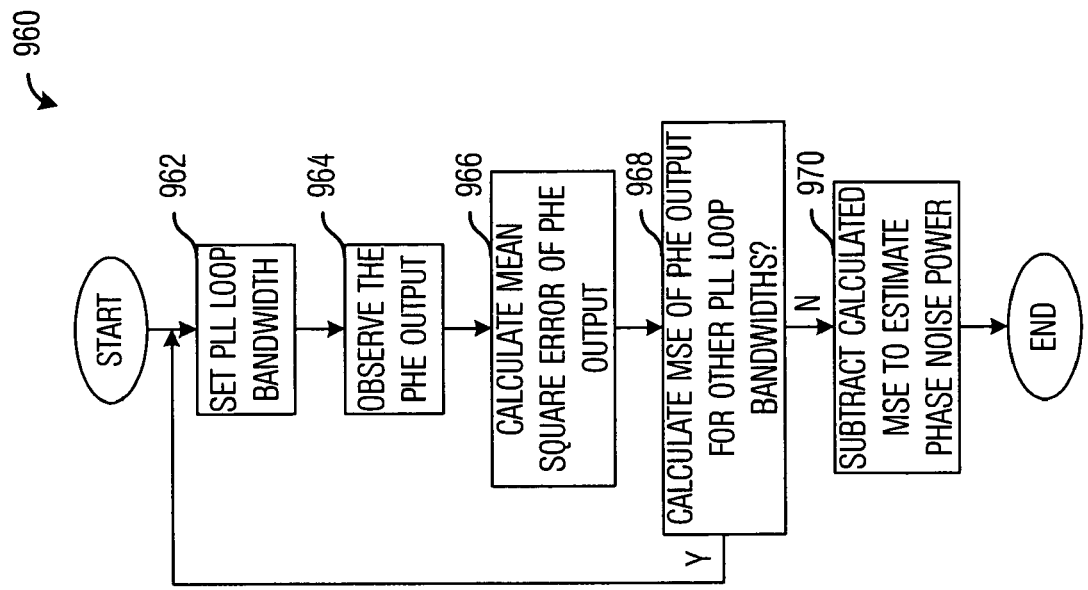
Figure 9C:
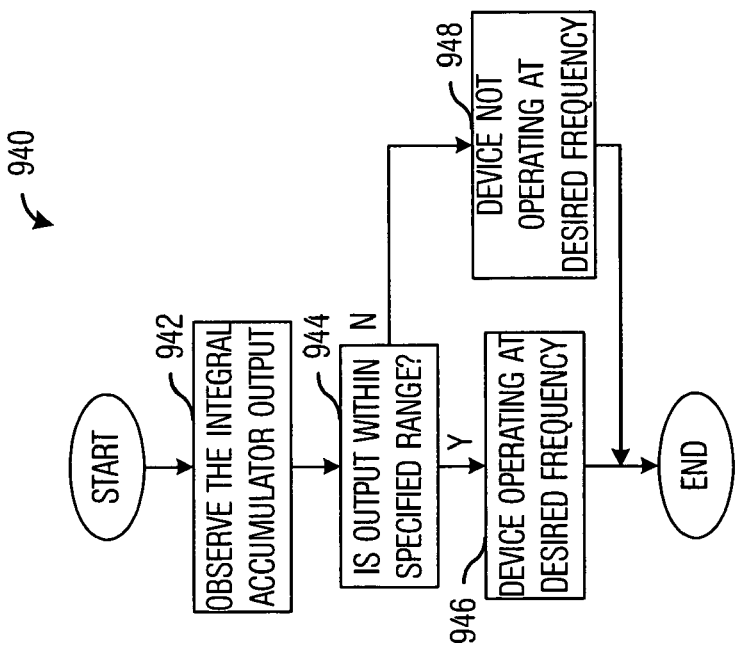

With reference now to FIG. 9*c*, there is shown a diagram illustrating a sequence of operations 940 that can be used to detect frequency deviation in an all-digital frequency synthesizer and/or transmitter, according to a preferred embodiment of the present invention. When an ADPLL is operating in a type-II mode, an output of an integral path accumulator (a part of the loop filter 215) can indicate a well filtered frequency error. If the ADPLL is operating in a type-I mode, then an IIR filter can be added to perform the needed filtering of the frequency error. Note that for an ADPLL that is capable of operating in either mode, a switching capability may be needed to switch in and out the IIR filter. After observing the output of the integral path accumulator (or the output of the IIR filter) (block 942), a simple comparison of the output with a specified range (block 944) can be used to determine if the frequency deviation is within a permitted amount. If the output is within a specified range, then the frequency deviation is within a permitted amount (block 946). If the output is outside of a specified range, then the frequency deviation is greater than the permitted amount (block 948).

With reference now to FIG. 9*d*, there is shown a diagram illustrating a sequence of operations that can be used to estimate phase noise power in an all-digital frequency synthesizer and/or transmitter, according to a preferred embodiment of the present invention. As discussed previously, the performance and/or compliance testing may not be solely limited to the computation of a simple binary pass/fail measurement regarding the performance and/or compliance of a device under test. In some tests, the device under test may receive adjustments to a part (or parts) of its PLL loop and have its digital signals observed after the adjustments. The adjustments can be performed multiple times and the observed digital signals (observed subsequent to each adjustment) can be compared and manipulated to provide a measure of the performance of the device under test.

It can be shown (referencing FIG. 7*c*) that the phase relationship between oscillator phase noise, $\theta_V$, which is an estimated parameter, and phase error, $\theta_E$, which is an observed parameter, is a high-pass transfer function. The PLL loop bandwidth can be controlled by a proportional gain factor, $\alpha$, when the PLL loop is in a type-I configuration and both the proportional gain factor, $\alpha$, and an integral gain factor, p, (also a digital control signal) when the PLL loop is in a type-II configuration. Please refer to the diagram of the linear s-domain model 600 of the ADPLL for a reference for the oscillator phase noise, $\theta_V$, the phase error, $\theta_E$, and the proportional gain factor, a, and integral gain factor, $\rho$. Therefore, it can be possible to accurately estimate the total oscillator integrated phase noise above a given frequency by setting the PLL loop bandwidth (block 962) and then observing (block 964) and calculating (block 966) the mean square error (MSE) of the PHE signal. The setting (block 962), observing (block 964), and calculating (block 966) can be repeated (block 968) for several PLL loop bandwidths. After the calculating is completed for the desired PLL loop bandwidths, the phase noise power can be estimated by subtracting (block 970) the calculated MSE of the PHE signal for the different PLL loop bandwidths. Note that a type-II ADPLL loop with possible addition of IIR filters can be used to make the transition band sharper (see FIG. 7*c*). FIG. 7*c* can also reveal that good frequency selectivity can be achieved by utilizing frequency peaking obtained with a dumping factor, $\zeta$, of less than one. Furthermore, additional peaking can be obtained inside or outside the PLL loop via IIR filters.

In addition to the specific tests discussed in FIGS. 9*a*, 9*b*, 9*c*, and 9*d*, other tests that can be performed via the observation of a digital signal from the PLL loop can include spurious content, phase noise analysis, spectrum analysis, rms computation of the phase noise, and so forth. The spurious content, phase noise analysis and spectrum analysis can be measured by performing spectral analysis on the PHE signal or its filtered version. The spectral analysis methods include FFT, DFT calculations or passing the PHE signal through a configurable band-pass filter and measuring the energy at the output.

Note that the above discussion focused on the use of the PHE signal in the testing. However, it can be possible that other signals within the PLL loop can be used in place of the PHE signal, sometimes with better results. Furthermore, the phase error trajectory, the frequency lock, and the frequency deviation are only three exemplary tests that can be performed. Other tests may be possible, and the discussion of the three tests should not be construed as limiting the spirit of the present invention.

Figure 10:
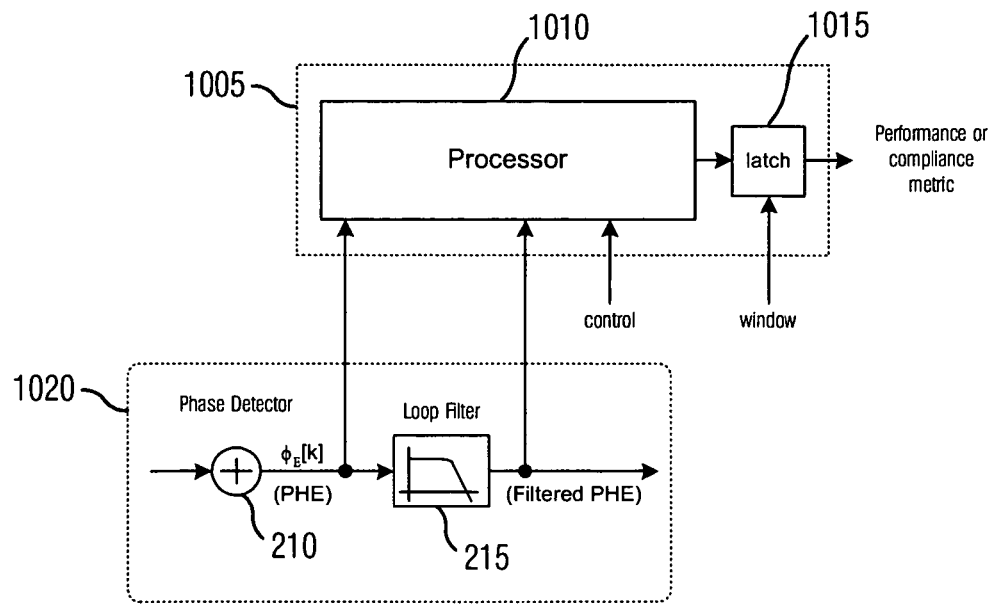
FIG. 10 is a diagram of a signal analyzer, according to a preferred embodiment of the present invention.

With reference now to FIG. 10, there is shown a diagram illustrating a signal analyzer 1005 coupled to an all-digital frequency synthesizer or transmitter (collectively referred to as block 1020) to permit the observation of digital signals and the generation of a performance or compliance metric, according to a preferred embodiment of the present invention. According to a preferred embodiment of the present invention, the signal analyzer 1005, which can be integrated onto the same integrated circuit as the all-digital frequency synthesizer or transmitter (block 1020), can observe digital signals from within the all-digital frequency synthesizer or transmitter (block 1020) and provide necessary signal processing to generate a performance or compliance metric. Alternatively, the signal analyzer 1005 may be located on a separate integrated circuit and can be coupled to the all-digital frequency synthesizer or transmitter (block 1020) via signal lines.

The signal analyzer 1005 may include a processor 1010 and a latch 1015. The processor 1010 can be coupled to the all-digital frequency synthesizer or transmitter (block 1020) at several places to permit the observation of different digital signals. For example, the processor 1010 may be connected to an output of the phase detector 210 to provide access to the PHE signal or to an output of the loop filter 215 to provide access to a filtered version of the PHE signal. The processor 1010 may be a dedicated processing element that is a part of the integrated circuit containing the all-digital frequency synthesizer or transmitter (block 1020) or it may be custom designed functional unit that is expressly designed to perform needed testing. External signals ("control") can be applied to control the testing. For example, the external signals can be used to enable or disable testing, specify the test to be performed, and so forth. The latch 1015 can be used to store the results produced by the processor 1010 to enable them to be read-out and evaluated.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for testing a radio frequency (RF) circuit comprising:
   observing a signal from the RF circuit, wherein the signal is a digital signal from within a processing portion of the RF circuit, wherein the signal has a high degree of correlation with an RF output of the RF circuit, and wherein the observing occurs outside of the RF circuit;
   manipulating the signal outside of the RF circuit using other circuitry; and producing a metric for the test outside of the RF circuit based on results from the manipulating.

2. The method of claim 1, wherein the testing is performed using built-in self test (BIST) techniques.

3. The method of claim 1, wherein the signal is a phase error signal.

4. The method of claim 1, wherein the RF circuit is an all-digital circuit, and wherein the signal is an output of a component in an all-digital phase-locked loop in the RF circuit.

5. The method of claim 4, wherein the signal is an output of a phase detector.

6. The method of claim 5, wherein the signal has been filtered.

7. The method of claim 6, wherein the all-digital phase-lock loop is operating in a type-II mode, and the signal is an output of an integral accumulator of a loop filter.

8. The method of claim 6, wherein the all-digital phase-lock loop is operating in a type-I mode, and the signal is an output of an infinite impulse response filter coupled to the output of a loop filter.

9. The method of claim 6, wherein a loop filter coupled to an output of a phase detector performs the filtering, and wherein the signal is an output of the loop filter.

10. The method of claim 1, wherein the frequency of the signal is several orders of magnitude less than the frequency of the RF output.

11. The method of claim 1, wherein the test is for phase error trajectory and the signal is the output of a phase detector, and wherein the manipulation comprises measuring a change in the signal.

12. The method of claim 11, wherein the phase error trajectory is good when the change in the signal is less than a specified threshold.

13. The method of claim 11, wherein the measuring the change in the signal comprises measuring a peak, a variance, or a rate of change in the signal.

14. The method of claim 1, wherein the test is for frequency lock and the signal is the output of a phase detector, and wherein the manipulation comprises comparing a value of the signal over several samples.

15. The method of claim 1, wherein the test is for frequency deviation and the signal is an output of an integral accumulator of a loop filter, and wherein the manipulation comprises comparing the signal with a specified range.

16. The method of claim 15, wherein the frequency deviation is within acceptable limits when the signal is within the specified range.

17. The method of claim 15, wherein the manipulation further comprises comparing several samples of the signal.

18. The method of claim 15, wherein the RF circuit contains an all-digital phase-locked loop operating in a type-II mode.

19. The method of claim 1, wherein the RF circuit contains an all-digital phase-locked loop, and the method further comprises prior to the observing, setting the all-digital phase-locked loop to a certain bandwidth.

20. The method of claim 1, wherein the RF circuit is an all-digital frequency synthesizer.

21. The method of claim 1, wherein the RF circuit is an all-digital transmitter.

22. The method of claim 21, wherein the transmitter is used in a wireless communications network.

23. The method of claim 22, wherein the wireless communications network is Bluetooth compliant.

24. The method of claim 1, wherein the testing comprises a functional test or a compliance test of the RF circuit.

25. A method for testing a radio frequency (RF) circuit comprising:
   observing a phase error signal from the RF circuit, wherein the phase error signal is a digital signal from within a processing portion of the RF circuit, wherein the phase error signal has a high degree of correlation with an RF output of the RF circuit, wherein the observing occurs outside of the RF circuit, and wherein a transfer function between the phase error signal and the RF output phase is flat within a frequency band of interest;
manipulating the signal outside of the RF circuit using other circuitry; and
producing a metric for the test outside of the RF circuit based on results from the manipulating.

26. A method for testing a radio frequency (RF) circuit comprising:
observing a signal from the RF circuit, wherein the signal is a digital signal from within a processing portion of the RF circuit, wherein the signal has a high degree of correlation with an RF output of the RF circuit, wherein the RF circuit is an all-digital circuit, wherein the signal is an output of a gain normalization block in an all-digital phase-locked loop in the RF circuit and wherein the observing occurs outside of the RF circuit;
manipulating the signal outside of the RF circuit; and
producing a metric for the test outside of the RF circuit based on results from the manipulating.

27. A method for testing a radio frequency (RF) circuit comprising:
observing a signal from the RF circuit, wherein the signal is a digital signal from within a processing portion of the RF circuit, wherein the signal has a high degree of correlation with an RF output of the RF circuit, and wherein the observing occurs outside of the RF circuit:
manipulating the signal outside of the RF circuit;
producing a metric for the test outside of the RF circuit based on results from the manipulating;
wherein the test is for frequency lock and the signal is the output of a phase detector, and wherein the manipulation comprises comparing a value of the signal over several samples; and
wherein the frequency has been locked when a variance in the magnitude is less than a specified threshold.

28. The method of claim 14, wherein the samples are taken at different times.

29. A method for testing a radio frequency (RF) circuit containing an all-digital phase-locked loop comprising:
setting the all-digital phase-locked loop to a certain bandwidth;
observing a signal from the RF circuit, wherein the signal is a digital signal from within a processing portion of the RF circuit, wherein the signal has a high degree of correlation with an RF output of the RF circuit, and wherein the observing occurs outside of the RF circuit;
manipulating the signal outside of the RF circuit; and
producing a metric for the test outside of the RF circuit based on results from the manipulating, wherein the test is for estimating phase noise power and the signal is an output of a phase detector, and wherein the manipulating comprises calculating a mean square error of the signal.

30. A method for testing a radio frequency (RF) circuit containing an all-digital phase-locked loop comprising:
setting the all-digital phase-locked loop to a certain bandwidth;
observing a signal from the RF circuit, wherein the signal is a digital signal from within a processing portion of the RF circuit, wherein the signal has a high degree of correlation with an RF output of the RF circuit, and wherein the observing occurs outside of the RF circuit;
manipulating the signal outside of the RF circuit; and
producing a metric for the test outside of the RF circuit based on results from the manipulating, wherein the test is for estimating phase noise power and the signal is an output of a phase detector, wherein the manipulating comprises calculating a mean square error of the signal, wherein the setting, observing, and manipulating is repeated for several different all-digital phase-locked loop bandwidths, and wherein the producing comprises subtracting the calculated mean square errors for the several different all-digital phase-lock loop bandwidths.

31. A circuit comprising:
a processor coupled to a radio frequency (RF) circuit, the processor containing circuitry to manipulate digital signals from the RF circuit to provide a performance metric for the RF circuit, the digital signals having a high degree of correlation with an RF output of the RF circuit; and
a control signal input coupled to the processor, wherein the control signal input can enable an observation and manipulation of the digital signals.

32. The circuit of claim 31 further comprising a latch coupled to the processor, the latch to store the performance metric provided by the processor.

33. The circuit of claim 31, wherein the RF circuit is integrated onto a first integrated circuit, wherein the processor is integrated onto a second integrated circuit.

34. The circuit of claim 33, wherein the first and the second integrated circuits are the same integrated circuit.

35. The circuit of claim 31, wherein the RF circuit contains an all-digital phase-locked loop, and wherein the processor is coupled to an output of a phase detector.

36. The circuit of claim 31, wherein the RF circuit contains an all-digital phase-locked loop, and wherein the processor is coupled to a filtered output of a phase detector.

37. The circuit of claim 31, wherein the RF circuit contains an all-digital phase-locked loop, and wherein the processor is coupled to an output of a phase detector and a filtered output of a phase detector.

38. The circuit of claim 31, wherein the circuit permits the testing of the RF circuit in wafer, in packaged integrated circuit, in factory, and in field.

39. The circuit of claim 31, wherein the circuit permits the testing of the RF circuit, and wherein the testing is of a type selected from a group consisting of a phase trajectory error, a frequency lock, a frequency deviation, a phase noise power, or combinations thereof.

40. A circuit comprising:
a reference phase accumulator coupled to a signal input, the reference phase accumulator containing circuitry to compute a reference phase;
a phase detector coupled to the reference phase accumulator, the phase detector containing circuitry to compute a difference between the reference phase and a variable phase;
a digitally-controlled oscillator (DCO) coupled to the phase detector, wherein the performance of the DCO can be ascertained by a test circuit outside of the circuit observing an output of the phase detector, wherein the test circuit manipulates the observed output and generates a performance metric for the DCO based, at least in part, on the manipulation; and
a variable phase accumulator coupled to the DCO and the phase detector, the variable phase accumulator containing circuitry to compute the variable phase.

41. The circuit of claim 40 further comprising a time-to-digital converter (TDC) coupled to the DCO and the phase detector, the TDC containing circuitry to compute a time difference between a reference clock and a variable clock.

42. The circuit of claim 40 further comprising a loop filter coupled to the phase detector and the DCO, the loop filter to provide a desired amount of attenuation to the computed difference between the reference phase and the variable phase.

43. The circuit of claim 40 further comprising a gain normalization unit coupled to the phase detector and the DCO, the gain normalization unit to normalize the difference between the reference phase and the variable phase with respect to a gain in the DCO.

44. A circuit comprising:
- a reference phase accumulator coupled to a signal input, the reference phase accumulator containing circuitry to compute a reference phase;
- a phase detector coupled to the reference phase accumulator, the phase detector containing circuitry to compute a difference between the reference phase and a variable phase;
- a digitally-controlled oscillator (DCO) coupled to the phase detector, wherein the performance of the DCO can be ascertained by a test circuit outside of the circuit observing an output of the phase detector, wherein the test circuit manipulates the observed output and generates a performance metric for the DCO based, at least in part, on the manipulation;
- a variable phase accumulator coupled to the DCO and the phase detector, the variable phase accumulator containing circuitry to compute the variable phase; and
- a loop filter coupled to the phase detector and the DCO, the loop filter to provide a desired amount of attenuation to the computed difference between the reference phase and the variable phase, wherein the loop filter is of a type selected from a group consisting of a finite impulse response filter, an infinite impulse response filter or combination thereof.

45. The circuit of claim 44, wherein the loop filter is comprised of a plurality of filters, and wherein the filters are arranged in a parallel fashion.

46. The circuit of claim 44, wherein the loop filter is comprised of a plurality of filters, and wherein the filters are arranged in a cascaded fashion.

47. A method for operating a cellular phone, comprising:
- performing built-in self-test (BIST) on a phase error trajectory parameter associated with the cellular phone; and
- reporting to a cellular service provider through a wireless medium when the BIST reports the phase error trajectory parameter to be degraded beyond a limit.

48. The method of claim 47, wherein the performing step is done on power-up of the cellular phone.

49. The method of claim 47, further comprising a step of notifying a user of the cellular phone that the parameter is degraded beyond a limit.

50. The method of claim 49, wherein the notifying step is done wirelessly.

51. The method of claim 49, wherein the notifying step is done through a service bill.

\* \* \* \* \*